US 6,717,400 B2

(12) United States Patent
Ito et al.

(10) Patent No.: US 6,717,400 B2
(45) Date of Patent: *Apr. 6, 2004

(54) PULSE SIGNAL GENERATOR WITH MOVABLE MAGNETIC ELEMENT

(75) Inventors: Tomoaki Ito, Tokyo (JP); Masami Tanaka, Tokyo (JP); Tadashi Kubota, Tokyo (JP); Yasuhiro Masuzaki, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 223 days.

This patent is subject to a terminal disclaimer.

(21) Appl. No.: 09/983,424

(22) Filed: Oct. 24, 2001

(65) Prior Publication Data

US 2003/0075995 A1 Apr. 24, 2003

(51) Int. Cl.[7] .................................................. G01B 7/14
(52) U.S. Cl. .............................. 324/207.13; 324/207.25
(58) Field of Search ......................... 324/207.13, 207.25, 324/207.26, 207.15, 174, 207.17, 207.22

(56) References Cited

U.S. PATENT DOCUMENTS 5,210,490 A * 5/1993 Munch et al. ......... 324/207.17

6,566,861 B2 * 5/2003 Ito et al. ................ 324/207.13

FOREIGN PATENT DOCUMENTS

| EP | 0987522 A | 3/2000 |
|----|-----------|--------|
| EP | 0987523 A | 3/2000 |

* cited by examiner

Primary Examiner—Russell Adams
Assistant Examiner—Subhash Zaveri
(74) Attorney, Agent, or Firm—Kanesaka & Takeuchi

(57) ABSTRACT

A pulse signal generator comprises a magnetic element (1) capable of producing large Barkhausen jumps; a generating unit for generating a magnetic field, which is changed by the object to be detected (5) to cause the magnetic element to produce the large Barkhausen jumps; the generating unit consists of a pair of elongated magnet/yoke combinations (3,6 and 4,7) provided on opposite sides of the magnetic element (1) such that their poles are oriented in opposite directions, forming a detecting area at an end thereof (3A, 4A); a detecting unit (2) for detecting the large Barkhausen jumps to produce a corresponding pulse signal; the magnetic element (1) having a first length between a second length of the magnet/yoke combinations and a half of the second length and provided toward the detecting area; and an adjusting yoke (8) movable along one of the elongated magnet/yoke combinations (3, 6).

3 Claims, 7 Drawing Sheets

PULSE SIGNAL GENERATOR WITH MOVABLE MAGNETIC ELEMENT

BACKGROUND OF THE INVENTION

1. Field of the Invention

The present invention relates to pulse signal generators.

2. Description of the Related Art

Pulse signal generators responsive to the position or speed of a moving object or a variety of operations have been used in the fields of automatic controls, and electrical and electronics equipment.

An example of the pulse signal generators of this type is a rotation detector that employs an electromagnetic, light pick-up, or Hole or magnetic reluctance element. The electromagnetic type, however, suffers from a low output at low speed rotations. The light pick-up type requires a broadband d-c amplifier and a dust-proof structure. The Hole or magnetic reluctance type requires a plurality of elements and an amplifier. Some elements of the light pick-up/Hole/magnetic reluctance type are too sensitive to temperatures to be used in the atmosphere that can have a large temperature change.

Consequently, where the rotation detector is used to detect the rotary speed or position of a crank or cam shaft of a car, it is impossible to detect very low to high speed rotations. In addition, it is necessary to provide an interface circuit for an engine control module. Moreover, the rotation detector is not suitable for use in automobiles where it can be exposed to temperature changes or noise. Furthermore, it is difficult for the rotation detector to make a stop/move decision (whether the car is at rest or in motion) when the power is on.

Japanese patent application Kokai No. 2000-101401 discloses a pulse signal generator that employ a magnetic element wire capable of producing large Barkhausen jumps to detect very low to high speed rotations. The pulse signal generator is able to resolve the above-mentioned problems but needs further improvements for use in automobiles.

For example, in order to increase the change of a magnetic field applied to the magnetic element wire under set and reset conditions, an adjusting yoke is attached to the rear face of the magnet, the length of the magnetic element wire is reduced below a half of the length of the magnet and yoke combined, the magnetic fields by a pair of magnets are made different by changing the power, volume, or shape of the magnets, the position of the magnetic element wire is changed relative to the magnets, or the magnets are tilted relative to each other.

Also, it is necessary to reduce the manufacturing cost and size of a unit, the time for assembly and adjustment, variations in the product quality, and the product yield. The pulse signal generator of JP 2000-101401, however, fails to meet these requirements.

SUMMARY OF THE INVENTION

Accordingly, it is an object of the invention to provide a pulse signal generator capable of meeting such requirements as described above.

According to an embodiment of the invention there is provided a pulse signal generator comprising a magnetic element capable of producing large Barkhausen jumps; a generating unit for generating a magnetic field, which is changed by the object to be detected to cause the magnetic element to produce the large Barkhausen jumps, the generating unit consisting of a pair of elongated magnet/yoke combinations provided on opposite sides of the magnetic element such that their poles are oriented in opposite directions, forming a detecting area at an end thereof; a detecting unit for detecting the large Barkhausen jumps to produce a corresponding pulse signal; the magnetic element having a first length between a second length of the magnet/yoke combinations and a half of the second length and provided toward the detecting area; and an adjusting yoke movable along one of the elongated magnet/yoke combinations.

According to another embodiment of the invention there is provided a pulse signal generator comprising a magnetic element capable of producing large Barkhausen jumps; a generating unit for generating a magnetic field, which is changed by the object to be detected to cause the magnetic element to produce the large Barkhausen jumps, the generating unit consisting of a pair of elongated magnet/yoke combinations provided on opposite sides of the magnetic element such that their poles are oriented in opposite directions, forming a detecting area at an end thereof; a detecting unit for detecting the large Barkhausen jumps to produce a corresponding pulse signal; the magnetic element having a first length between a second length of the magnet/yoke combinations and a half of the second length and provided toward the detecting area; and the magnetic element being made movable such that a first distance between the magnetic element and one of the elongated magnet/yoke combinations and a second distance between the magnetic element and the other of the elongated magnet/yoke combinations are different.

According to sill another embodiment of the invention there is provided a pulse signal generator comprising a magnetic element capable of producing large Barkhausen jumps; a generating unit for generating a magnetic field, which is changed by the object to be detected to cause the magnetic element to produce the large Barkhausen jumps, the generating unit consisting of a pair of elongated magnet/yoke combinations provided on opposite sides of the magnetic element such that their poles are oriented in opposite directions, forming a detecting area at an end thereof; a detecting unit for detecting the large Barkhausen jumps to produce a corresponding pulse signal; the magnetic element having a first length between a second length of the magnet/yoke combinations and a half of the second length and provided toward the detecting area; and the magnetic element being made movable such that a first distance between the magnetic element and an upper edge of the elongated magnet/yoke combinations and a second distance between the magnetic element and a lower edge of the elongated magnet/yoke combinations are different.

DESCRIPTION OF THE PREFERRED EMBODIMENTS

Embodiments of the invention will now be described with reference to the accompanying drawings.

Figure 1:
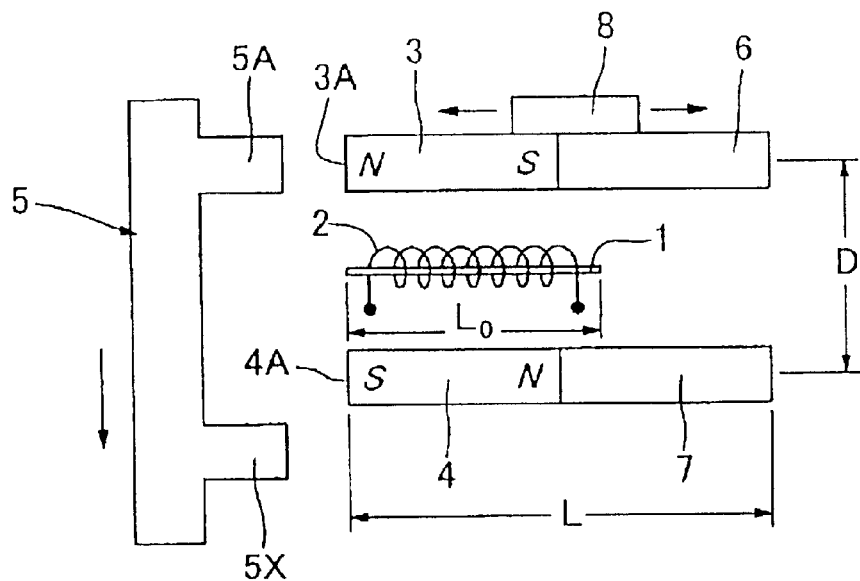
FIG. 1 is a plan view of a pulse signal generator in the set state according to an embodiment of the invention.

In FIG. 1, a pulse signal generator comprises a wire-shaped magnetic element 1, a detecting coil 2 wound around the magnetic element 1, a pair of permanent magnets 4 and 5 disposed on opposite sides of the magnetic element 1 such that their poles are oriented in opposite directions, a pair of yokes 6 and 7 connected to the permanent magnets 4 and 5, respectively, and an adjusting yoke 8 movable along the permanent magnet 3 and the yoke 6 such that its position may be adjusted. The magnetic poles 3A and 4A of the permanent magnets 3 and 4 constitute a detecting area in which the magnetic field applied to the magnetic element 1 is changed by the motion of teeth 5A, 5B, ... 5X of a toothed wheel 5 to generate large Barkhausen jumps which in turn produce a pulse signal across the detecting coil 2. The structure and function of the magnetic element 1 is described in JP 2000-101401 and, therefore, its detailed description will be omitted.

The permanent magnets 3 and 4 and the yokes 6 and 7 have a magnetic axis parallel to the longitudinal direction of the magnetic element 1. The length of the magnetic element 1, Lo, is set between L and L/2 wherein L is the total length of the permanent magnet and the yoke. The adjusting yoke 8 is made of a magnetic block having a length less than the total length L and its position may be adjusted along the magnetic axis. The adjusting yoke 8 may be a block of permanent magnet.

Figure 2:
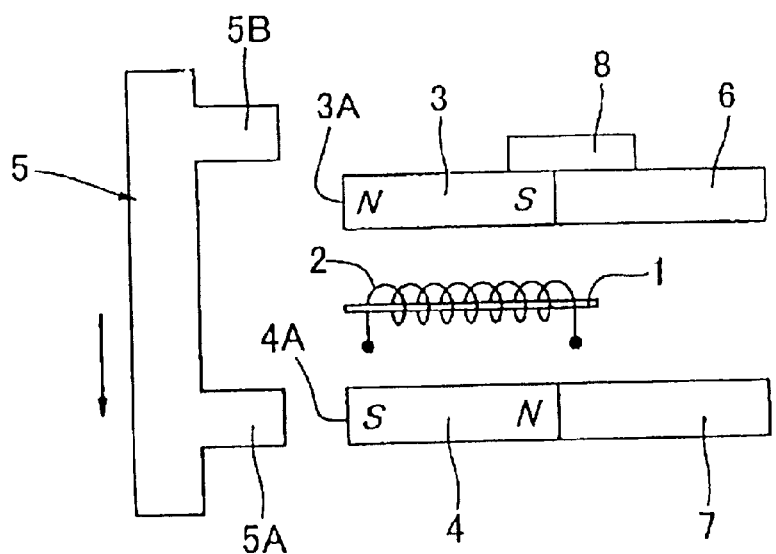
FIG. 2 is a plan view of the pulse signal generator in the reset state.

In FIG. 1, the tooth 5A of the toothed wheel 5 faces the N pole 3A of the permanent magnet 3 while the advanced tooth 5X already has passed the S pole 4A of the permanent magnet 4, under which the pulse signal generator is in the set state. In FIG. 2, the toothed wheel 5 is moved in the direction of an arrow so that the tooth 5A faces the S pole of the permanent magnet 4 while the trailing tooth 5B does not reach yet the N pole 3A of the permanent magnet 3. The pulse signal generator is now in the reset state, causing a large Barkhausen jump in the magnetic element 1 which in turn generates a pulse across the detecting coil 2. In this way, every time a tooth of the toothed wheel 5 passes through the vicinity of the magnetic poles 3A and 4A, a pulse is generated across the detecting coil 2.

According to the invention, the magnetic change due to the large Barkhausen jump produced in the magnetic element 1 is detected by the detecting coil 2 and a pulse voltage is established by electromagnetic action. Consequently, a sequence of presence and absence of the teeth 5A, 5B, etc. of the toothed wheel 5 produces a sequence of large Barkhausen jumps in the magnetic element 1 regardless of the speed thereof, thus making it possible to produce a pulse signal. In this way, it is possible to detect the object moving at very low speeds. The generated pulse signal maintains a constant voltage and phase relationship. That is, the amplitude of the pulse voltage is kept at a constant level regardless of the speed of the object to be detected.

The operational principle will be described in more detail with reference to FIGS. 3–6.

Figure 3:
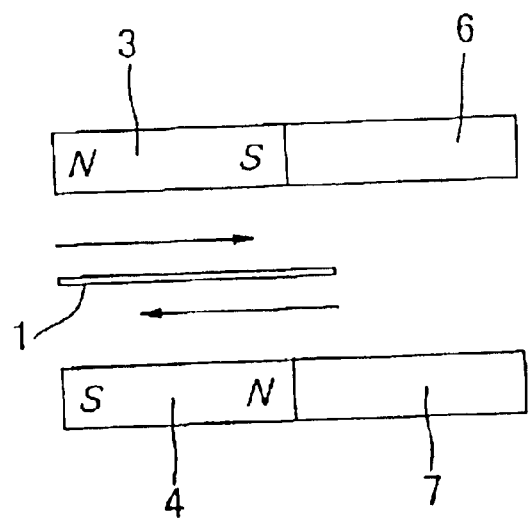
FIGS. 3–5 are plan views of the pulse signal generator with no adjusting yoke equipped for use in explanation of the operational principle.

In FIG. 3, the magnetic fields applied to the magnetic element 1 provided between a pair of the permanent magnets 3 and 4 and the yokes 6 and 7 are indicated by arrows. Where the magnetic element 1 is provided in the middle between the upper and lower permanent magnets 3 and 4 that have the same size and equal magnetic power, the magnetic field upon the magnetic element 1 is zero (0) because the magnetic fields in the positive and negative directions applied to the magnetic element 1 by the upper and lower permanent magnets 3 and 4, respectively, have equal strengths and offset each other.

Figure 4:
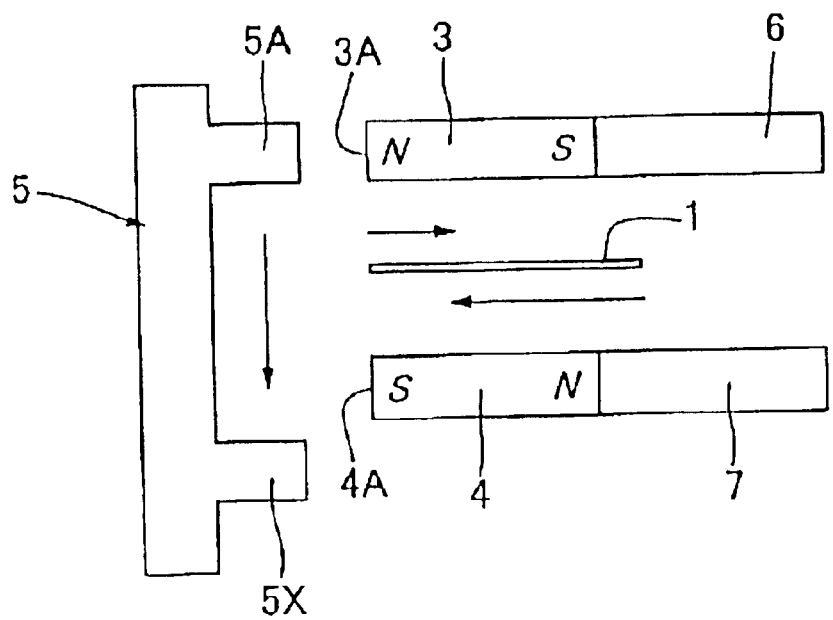

In FIG. 4, where the tooth 5A of the toothed wheel 5 faces the N pole 3A of the upper permanent magnet 3, the magnetic fields applied to the magnetic element 1 are indicated by arrows. In the set state of FIG. 4, a considerable portion of the positive magnetic field produced by the upper permanent magnet 3 flows into the toothed wheel 5A, which is made of a magnetic material, so that the remaining field is reduced as indicated by the arrow. The S pole 4A of the lower permanent magnet 4 does not face the tooth 5A so that the magnitude of the negative magnetic field upon the magnetic element 1 by the permanent magnet 4 is substantially equal to that of FIG. 3 in which no toothed wheel is provided. Consequently, as a whole, the negative magnetic field is applied to the magnetic element 1 in the set state of FIG. 4. This negative magnetic field is called hereinafter "second magnetic field."

Figure 5:
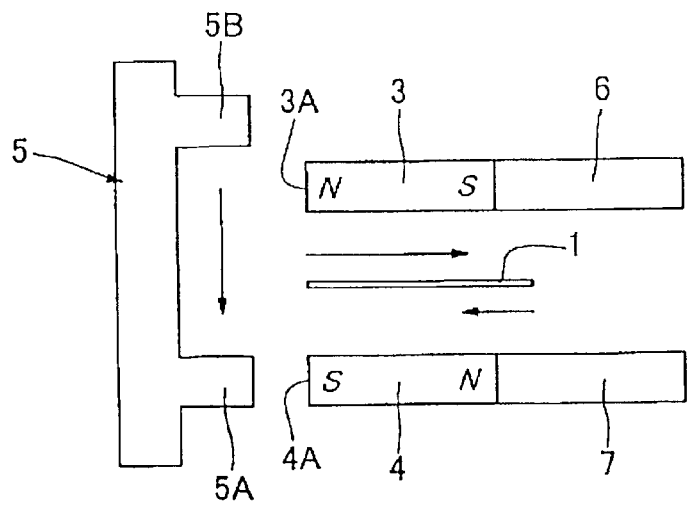

In FIG. 5, when the tooth 5A has moved from the N pole 3A of the upper permanent magnet 3 to the S pole 4A of the lower permanent magnet 4, the magnetic fields upon the magnetic element 1 between the permanent magnets 3 and 4 and the yokes 6 and 7 are indicated by arrows. In the reset state of FIG. 5, the negative magnetic field upon the magnetic element 1 by the lower permanent magnet 4 is reduced as indicated by the arrow since a considerable portion thereof branches to the tooth 5A of the object to be detected. The N pole 3A of the upper permanent magnet 3 does not face the tooth 5B so that the positive magnetic field by the permanent magnet 3 is substantially equal to that of FIG. 3. Consequently, as a whole, the positive magnetic field is applied to the magnetic element 1 in the reset state of FIG. 5. This positive magnetic field is called hereinafter "first magnetic field."

Figure 6:
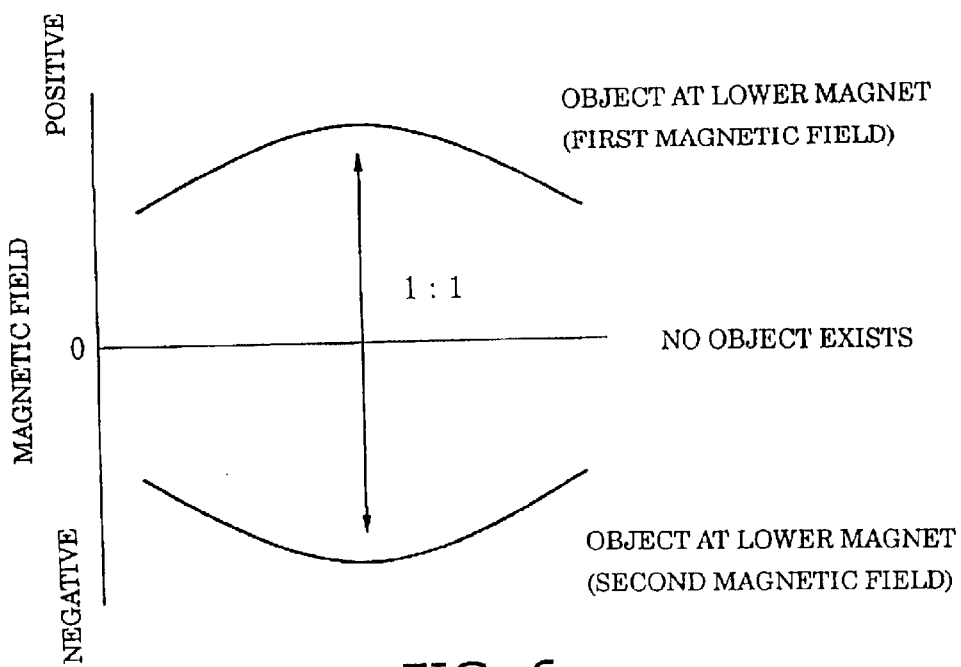
FIG. 6 is a graph showing the magnetic fields on the magnetic element in FIGS. 3–5.

In FIG. 6, the magnetic fields applied to the magnetic element 1 in the states of FIGS. 3, 4, and 5 are shown. Sequential application of the second and first magnetic fields to the magnetic element 1 produces a sequence of large Barkhausen jumps, generating a sequence of pulses. If the first and second magnetic fields are set as shown in FIG. 6 (no adjusting yoke 8 is provided), their ratio becomes 1:1. In order to produce better large Barkhausen jumps, the ratio should be N:1 wherein N is a number except for 1. According to the invention, the positions of the adjusting yoke 8 and the magnetic element 1 are specified, or the position of the adjusting yoke 8 is made changeable. In this embodiment, the adjusting yoke 8 is made movable along the longitudinal direction of the permanent magnet 3 and the yoke 6 to increase changes of the magnetic field upon the magnetic element 1 so that it is possible to shorten the adjusting time which in turn shortens the manufacturing time and increases the yield of the product.

Figure 7:
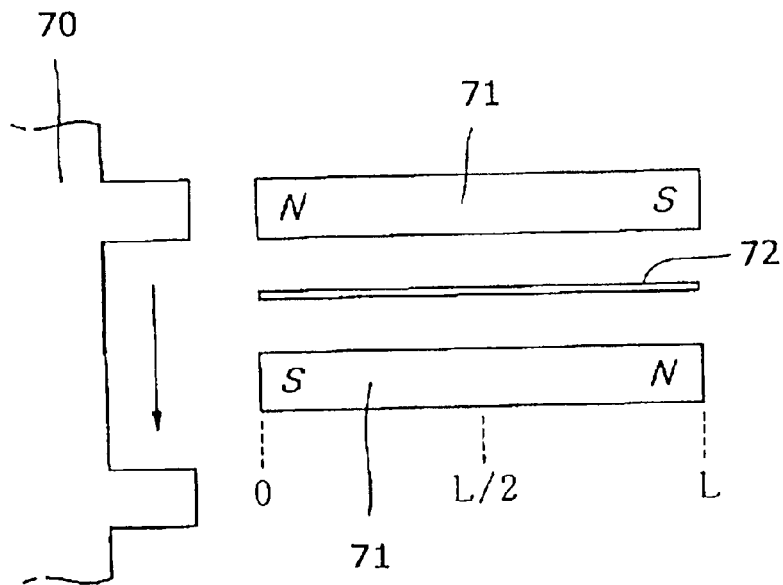
FIGS. 7 and 8 are plan views of pulse signal generators for use in explaining the production of better large Barkhausen jumps.
Figure 8:
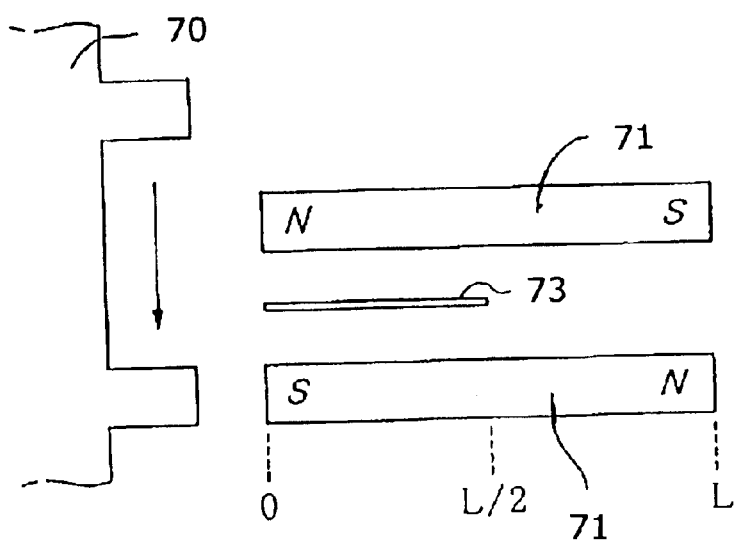
Figure 9:
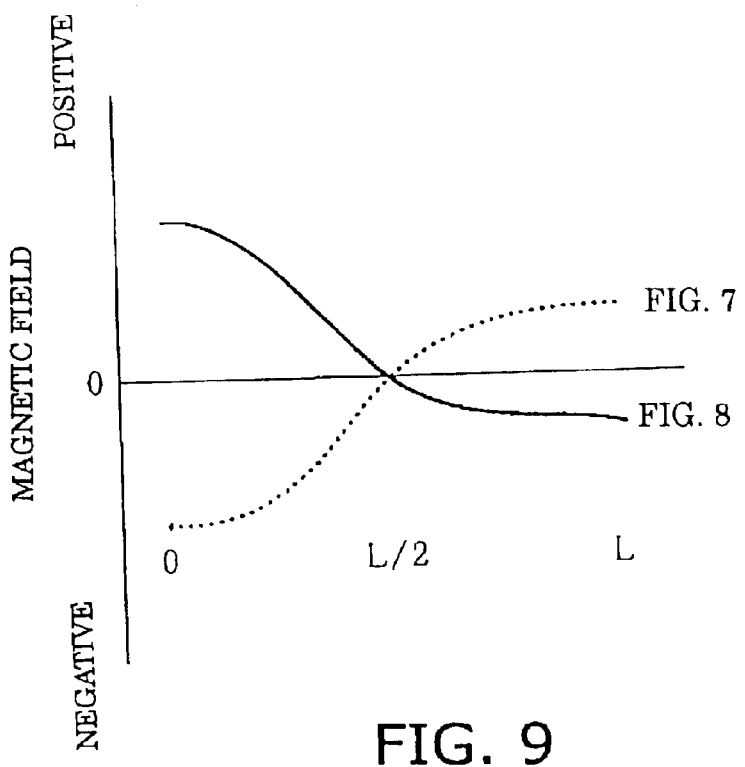
FIGS. 9 and 10 are graphs of magnetic fields upon the magnetic element.

In the aforementioned JP 2000-101401, the magnetic element 1 is positioned toward the front end of the permanent magnet to produce better large Barkhausen jumps. The reason will be described with reference to FIGS. 7–9. First of all, the pulse signal generator of this type needs an alternating magnetic field. As shown in FIGS. 7 and 8, when the object 70 moves, the magnetic fields on the magnetic element 72 provided between the magnets 71 change as shown in FIG. 9. The magnetic fields of FIG. 9 are obtained for the magnetic element 72 of FIG. 7. The magnetic field at a point of 0 is higher than that of a point of L because it is closer to the object. Where the magnetic element 72 is positioned as shown in FIG. 7, the positive-to-negative and negative-to-positive magnetic fields are used in intervals of 0–L/2 and L/2–L, respectively, so that the magnetic fields crash within the magnetic element 72. This collision of magnetic fields can be avoided by providing the magnetic element 73 of a half length of the magnetic element 72 in the area of either a front or rear half of the magnet as shown in FIG. 8. When the magnetic element 73 is positioned in the front half area, the alternating magnetic field becomes higher, producing better large Barkhausen jumps. If the front and rear magnetic fields are 5 and 2 (absolute value), respectively, the alternating magnetic fields becomes ±5 and ±2 for the front and rear magnetic positions, respectively. For the magnetic element 72 placed along the entire length of the magnet 71, the front-to-rear magnetic field becomes ±3. Thus, the magnetic element 73 should be placed in the front position or toward the object to be detected.

Figure 10:
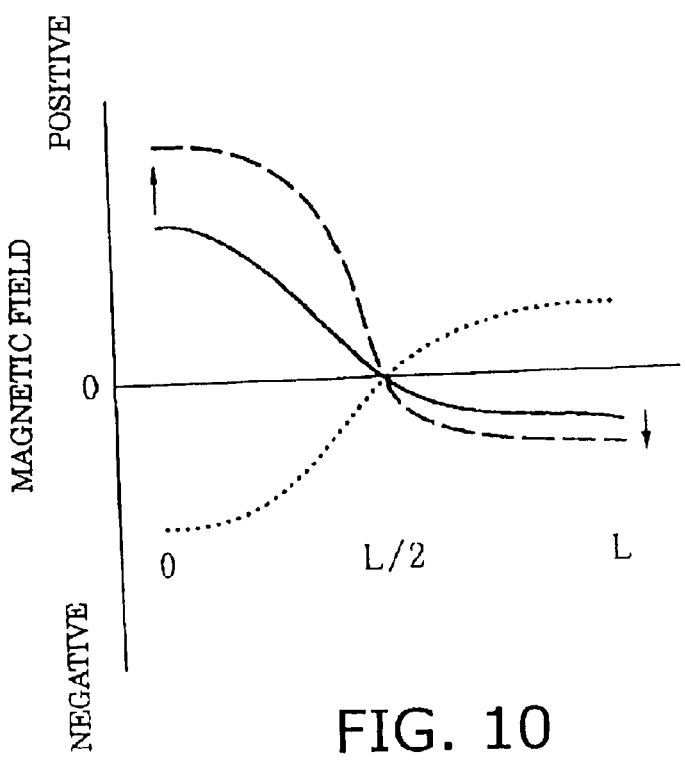

If the width of the magnet is increased, the magnetic power and the portion that acts on the object are increased so that the magnetic field (absolute value) is increased as shown by arrows in FIG. 10. That is, the magnitude of the alternating magnetic field increases, producing more improved large Barkhausen jumps.

For the same reason, by specifying the length of the magnetic element between the entire length of (the magnet and the yoke) and a half thereof, it is possible to provide still better large Barkhausen jumps, which in turn makes it possible to reduce the size and the manufacturing cost of the product.

Figure 11:
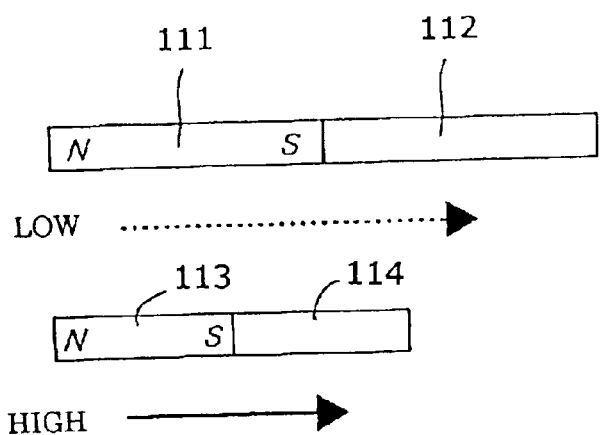
FIG. 11 is a top view of magnets for use in explaining the magnetic fields produced by the magnet/yoke combinations.

In FIG. 11, when the yoke 112 is connected to the magnet 111, the pole is established at the free end of the yoke 112, acting as one magnet. Consequently, a magnetic field is established along the magnet and yoke assembly as shown by a dotted arrow. Then, when a shorter magnet 113 and a shorter yoke 114 are connected, a similar but higher magnetic field is established as shown by a solid arrow because the poles are closer than before. The volume of the magnetic element is proportional to the power. That is, the length of the magnetic element is kept constant.

Figure 12:
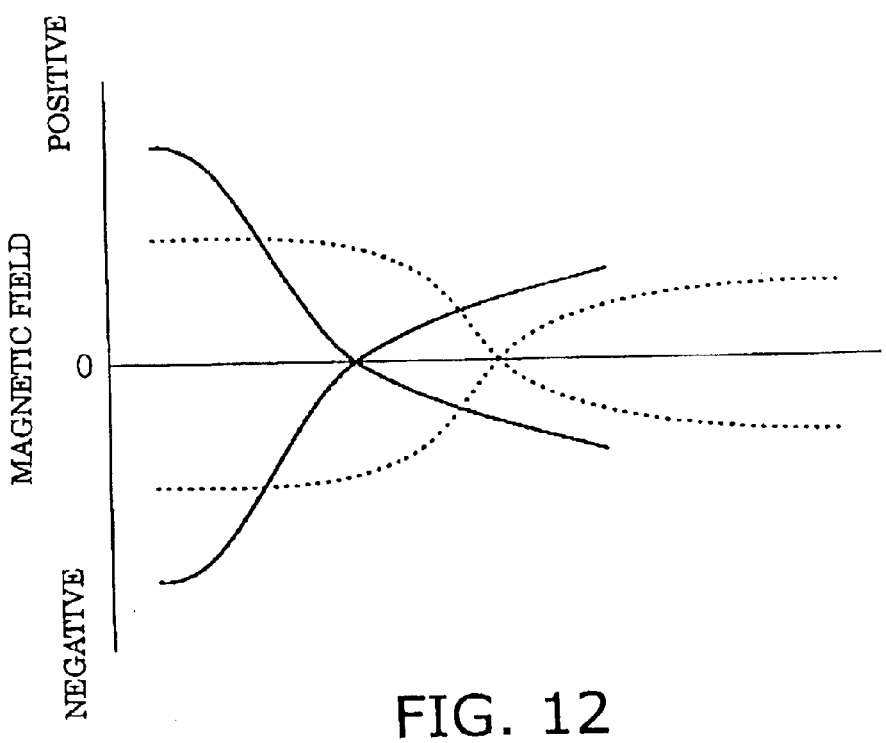
FIG. 12 is a graph of the magnetic fields produced by the magnet/yoke combinations of FIG. 11.

In FIG. 12, the alternating magnetic fields produced by the long and short magnets are indicated by dotted and solid lines, respectively. The magnetic element can not use effectively the alternating magnetic field of the dotted line but of the solid line. If the absolute values of the alternating magnetic field of the dotted line are 3 and 1 while the absolute values of the solid line are 5 and 2, then the magnetic element uses the alternating magnetic field of the dotted line having a value of 3 (=3–0) and the alternating magnetic field of the solid line having a value of 3 (=5–2). Thus, these alternating magnetic fields have the same value.

The distance D between the permanent magnets 3 and 4 and the yokes 6 and 7 is fixed in FIG. 1, but it may be made variable. If it is variable, it is easy to adapt for a toothed wheel with teeth arranged with a different pitch to generate a pulse signal adjusted accordingly.

The magnetic element 1 may be a thin or thick film or plate, with the detecting coil 2 of the flat shape. Also, a single layer of magnetic element may be used. The detecting coil may be replaced by a Hole or MR element, or resonant circuit. The adjusting yoke may be replaced by the following means.

Figure 13:
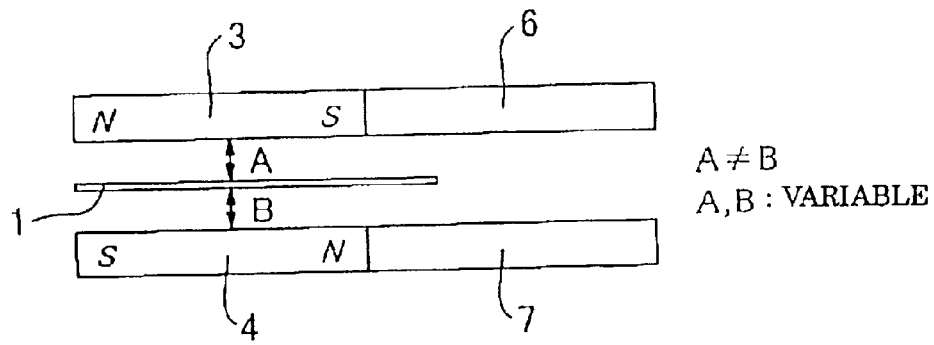
FIG. 13 is a plan view of the magnet/yoke combinations for explaining another adjusting unit.

In FIG. 13, the distances A and B between the magnetic element 1 and the magnet 3 and between the magnetic element 1 and the magnet 4 are made different and variable.

Figure 14:
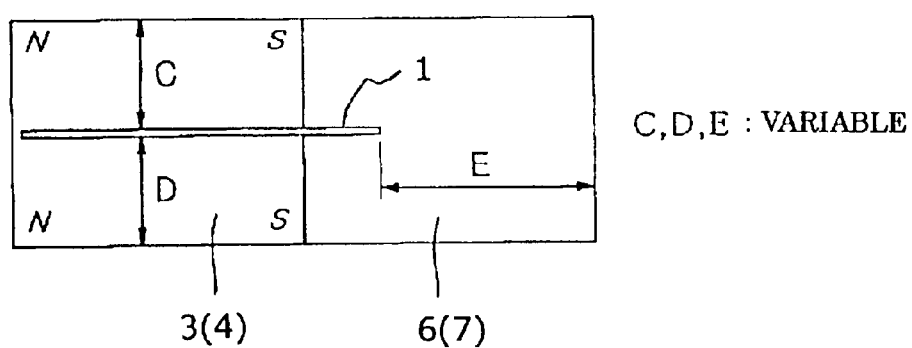
FIG. 14 is a side view of the magnet/yoke combination for explaining still another adjusting unit.

In FIG. 14, the distances C and D between the magnetic element 1 and the upper and lower edges of the magnet 3 or 4, respectively, and the distance E between the end of the magnetic element 1 and the end of the yoke 6 or 7 are made variable.

As has been described above, according to the invention, the manufacturing cost and the size of a pulse signal generator, its assembling and adjusting time, and variations in the product quality can be reduced.

What is claimed is:

1. A pulse signal generator comprising:
   a magnetic element capable of producing large Barkhausen jumps;
   generating means for generating a magnetic field, which is changed by the object to be detected to cause said magnetic element to produce said large Barkhausen jumps, said generating means consisting of a pair of elongated magnet/yoke combinations provided on opposite sides of said magnetic element such that their poles are oriented in opposite directions, forming a detecting area at an end thereof;
   detecting means for detecting said large Barkhausen jumps to produce a corresponding pulse signal;
   said magnetic element having a first length between a second length of said magnet/yoke combinations and a half of said second length and provided toward said detecting area; and an adjusting yoke movable along one of said elongated magnet/yoke combinations.

2. A pulse signal generator comprising:

a magnetic element capable of producing large Barkhausen jumps;

generating means for generating a magnetic field, which is changed by the object to be detected to cause said magnetic element to produce said large Barkhausen jumps, said generating means consisting of a pair of elongated magnet/yoke combinations provided on opposite sides of said magnetic element such that their poles are oriented in opposite directions, forming a detecting area at an end thereof;

detecting means for detecting said large Barkhausen jumps to produce a corresponding pulse signal;

said magnetic element having a first length between a second length of said magnet/yoke combinations and a half of said second length and provided toward said detecting area; and said magnetic element being movable such that a first distance between said magnetic element and one of said elongated magnet/yoke combinations and a second distance between the said magnetic element and the other of said elongated magnet/yoke combinations are different.

3. A pulse signal generator comprising:

a magnetic element capable of producing large Barkhausen jumps;

generating means for generating a magnetic field, which is changed by the object to be detected to cause said magnetic element to produce said large Barkhausen jumps, said generating means consisting of a pair of elongated magnet/yoke combinations provided on opposite sides of said magnetic element such that their poles are oriented in opposite directions, forming a detecting area at an end thereof;

detecting means for detecting said large Barkhausen jumps to produce a corresponding pulse signal;

said magnetic element having a first length between a second length of said magnet/yoke combinations and a half of said second length and provided toward said detecting area; and said magnetic element being made movable such that a first distance between said magnetic element and an upper edge of said elongated magnet/yoke combinations and a second distance between said magnetic element and a lower edge of said elongated magnet/yoke combinations are different.

* * * * *